US011276609B2

(12) United States Patent
Zhou

(10) Patent No.: US 11,276,609 B2
(45) Date of Patent: Mar. 15, 2022

(54) SEMICONDUCTOR STRUCTURE AND METHOD FOR FORMING THE SAME, AND A TRANSISTOR

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 49 days.

(21) Appl. No.: 16/863,249

(22) Filed: Apr. 30, 2020

(65) Prior Publication Data
US 2021/0035857 A1 Feb. 4, 2021

(30) Foreign Application Priority Data

Jul. 30, 2019 (CN) .......................... 201910697155.8

(51) Int. Cl.
*H01L 21/768* (2006.01)
*H01L 21/762* (2006.01)
(Continued)

(52) U.S. Cl.
CPC .. *H01L 21/76831* (2013.01); *H01L 21/31116* (2013.01); *H01L 21/76224* (2013.01);
(Continued)

(58) Field of Classification Search
CPC ......... H01L 21/76831; H01L 21/31116; H01L 21/76224; H01L 21/76802; H01L 21/76837; H01L 29/66545
See application file for complete search history.

(56) References Cited

U.S. PATENT DOCUMENTS

| 2015/0255458 A1* | 9/2015 | Ando | H01L 29/66795 257/401 |
| 2018/0040715 A1* | 2/2018 | Chang | H01L 29/66871 |
| 2020/0135880 A1* | 4/2020 | Chen | H01L 29/0847 |

* cited by examiner

*Primary Examiner* — Zandra V Smith
*Assistant Examiner* — Andre C Stevenson
(74) *Attorney, Agent, or Firm* — Crowell & Moring LLP

(57) ABSTRACT

A semiconductor structure and a method for forming the same, and a transistor are provided. In one form, a method includes: providing a base, where a dummy gate layer is formed on the base, a spacer is formed on a side wall of the dummy gate layer, an interlayer dielectric layer is formed on the base exposed from the dummy gate layer and the spacer, and the interlayer dielectric layer exposes a top of the dummy gate layer and a top of the spacer; removing a portion of a height of the dummy gate layer to form a remaining dummy gate layer, where the remaining dummy gate layer and the spacer enclose a trench; thinning a spacer exposed from the remaining dummy gate layer along a direction perpendicular to a side wall of the trench; after the thinning, removing the remaining dummy gate layer to form a gate opening within the interlayer dielectric layer; and forming a metal gate structure in the gate opening. Through the thinning, a gate opening whose side wall is provided with a remaining spacer is T-shaped. That is, a dimension of a top opening of the gate opening is increased, so that difficulty in forming the metal gate structure within the gate opening is reduced. That is, forming quality of the metal gate structure within the gate opening is helped to be improved, thereby improving performance of the transistor.

20 Claims, 5 Drawing Sheets

(51) Int. Cl.
*H01L 29/66* (2006.01)
*H01L 21/311* (2006.01)
(52) U.S. Cl.
CPC .. *H01L 21/76802* (2013.01); *H01L 21/76837* (2013.01); *H01L 29/66545* (2013.01)

SEMICONDUCTOR STRUCTURE AND METHOD FOR FORMING THE SAME, AND A TRANSISTOR

RELATED APPLICATIONS

The present application claims priority to Chinese Patent Appln. No. 201910697155.8, filed Jul. 30, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same, and a transistor.

Related Art

A main semiconductor device of an integrated circuit, especially a super-large-scale integrated circuit, is a metal-oxide-semiconductor field effect transistor (MOS transistor). With the continuous development of integrated circuit manufacturing technologies, a critical dimension of the MOS transistor becomes increasingly small, and various secondary effects caused by physical limits of devices appear successively, impeding scaling down of a critical dimension of the device. One of the most challenging problems is to alleviate large current leakage of a semiconductor device.

A solution that is currently proposed is to form a metal gate structure using a high-k metal gate (HKMG) technology. That is, to form a gate dielectric layer using a dielectric material (which is generally referred to as a high-k gate dielectric material) having a high dielectric constant, and to form a gate electrode using a conductive material (which is generally referred to as a metal material) including a metal element, so as to prevent a Fermi-level pinning effect and a boron penetrating effect from occurring between a high-k gate dielectric material and a conventional gate electrode material. Introduction of the high-k metal gate reduces current leakage of the semiconductor device.

SUMMARY

A problem to be addressed in embodiments and implementations of the present disclosure is to provide a semiconductor structure and a method for forming the same, and a transistor, so as to improve performance of a transistor.

To address the foregoing problem, one form of the present disclosure provides a method for forming a semiconductor structure, including: providing a base, where a dummy gate layer is formed on the base, a spacer is formed on a side wall of the dummy gate layer, an interlayer dielectric layer is formed on the base exposed from the dummy gate layer and the spacer, and the interlayer dielectric layer exposes a top of the dummy gate layer and a top of the spacer; removing a portion of a height of the dummy gate layer to form a remaining dummy gate layer, where the remaining dummy gate layer and the spacer enclose a trench; thinning a spacer exposed from the remaining dummy gate layer along a direction perpendicular to a side wall of the trench; after the thinning, removing the remaining dummy gate layer to form a gate opening within the interlayer dielectric layer; and forming a metal gate structure in the gate opening.

Another form of the present disclosure further provides a semiconductor structure, including: a base; an interlayer dielectric layer located on the base, wherein a gate opening exposing the base formed within the interlayer dielectric layer; a spacer located on a side wall of the gate opening, where the spacer includes a bottom spacer and a top spacer located on the bottom spacer, and where along a direction perpendicular to the side wall of the gate opening, a width of the bottom spacer is greater than a width of the top spacer; and a T-shaped metal gate structure located within the gate opening between the spacers.

Yet another form of the present disclosure provides a transistor, including: a base; an interlayer dielectric layer located on the base, where a gate opening exposing the base is formed within the interlayer dielectric layer; a bottom spacer covering a portion of a side wall of the gate opening that is close to a side of the base; a metal gate structure located in the gate opening exposed from the bottom spacer, the metal gate structure including: a T-shaped gate electrode layer, where the gate electrode layer includes a bottom gate electrode layer and a top gate electrode layer located on the bottom gate electrode layer, and where along a direction perpendicular to a side wall of the gate opening, a width of the top gate electrode layer is greater than a width of the bottom gate electrode layer; a work function layer located on a side wall of the bottom gate electrode layer, on a side wall and a bottom of the top gate electrode layer, and between a bottom of the gate electrode layer and the base; a high-k gate dielectric layer located between the work function layer and the bottom spacer and between the work function layer and the base; a trench enclosed by the interlayer dielectric layer, the bottom spacer, and the metal gate structure; and an etch blocking layer located within the trench.

Compared to the prior art, technical solutions of embodiments and implementations of the present disclosure have the following advantages:

Embodiments and implementations of the present disclosure provide a method for forming a semiconductor structure, including: removing the portion of the height of the dummy gate layer to form the remaining dummy gate layer, where the remaining dummy gate layer and the spacer enclose the trench; thinning the spacer exposed from the remaining dummy gate layer along the direction perpendicular to the side wall of the trench; and after the thinning, removing the remaining dummy gate layer to form the gate opening within the interlayer dielectric layer. Therefore, through the thinning, the T-shaped gate opening of the remaining spacer is formed on the side wall, so that a dimension of a top opening of the gate opening is increased, thereby reducing difficulty in forming the metal gate structure within the gate opening, and correspondingly helping to improve forming quality of the metal gate structure within the gate opening, and further improving performance of the formed transistor.

In some implementations, after forming a metal gate structure in the gate opening, the method further includes: removing a high-k gate dielectric layer and a top spacer that are located over the bottom spacer, to form a trench enclosed by the interlayer dielectric layer, the bottom spacer, and a remainder of the metal gate structure, and forming an etch blocking layer in the trench, where a source/drain doped region is usually formed within a base on both sides of the metal gate structure. In addition, the method for forming the semiconductor structure may further include: forming a contact plug within the interlayer dielectric layer on both sides of the metal gate structure, where the contact plug is electrically connected to the source/drain doped region. In embodiments and implementations of the present disclosure, the etch blocking layer is formed, helping to enlarge a process window for forming the contact plug, correspondingly reducing a probability of bridging between the contact plug and the metal gate structure, and improving an effect of electrical isolation between the contact plug and the metal gate structure, thereby further improving performance of the formed transistor.

In some implementations, after forming a trench and before forming an etch blocking layer in the trench, the method further includes: removing a portion of a height of a remainder of the metal gate structure, where after the etch blocking layer is formed in the trench, the etch stop layer correspondingly further covers a top of the remainder of the metal gate structure. Therefore, in a manufacturing procedure of forming the contact plug, the etch blocking layer on the top of the remainder of the metal gate structure can protect the top of the remainder of the metal gate structure, further enlarging the process window for forming the contact plug. For example, a self-aligned contact (SAC) etching process may be used.

DETAILED DESCRIPTION

A performance of current transistors can be improved. Reasons why the performance of a transistor is still to be improved are now analyzed in combination with a semiconductor structure.

Figure 1:
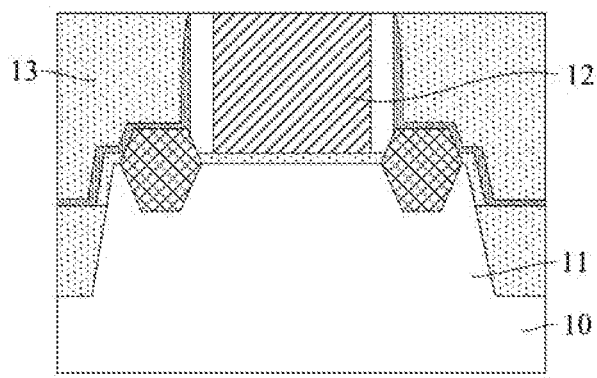
FIG. 1 to FIG. 3 are respective schematic structural diagrams of steps of a method for forming a semiconductor structure.
Figure 2:
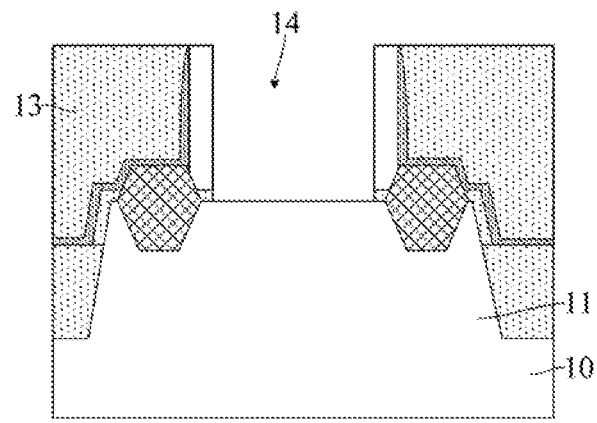
Figure 3:
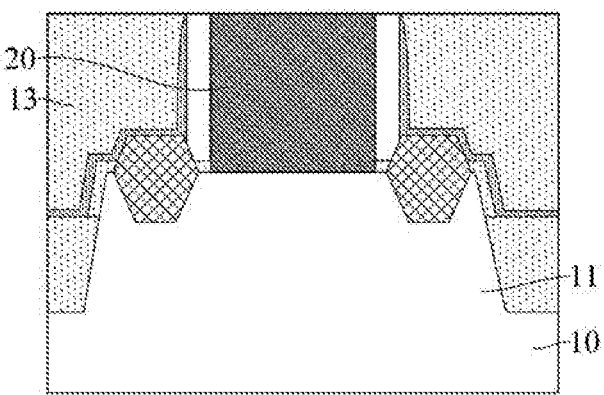

FIG. 1 to FIG. 3 illustrate respective schematic structural diagrams of steps in a method for forming a semiconductor structure are shown.

Referring to FIG. 1, a substrate 10 and a fin 11 protruding from the substrate 10 are provided, where a dummy gate layer 12 across the pin 11 is formed on the substrate 10, an interlayer dielectric layer 13 is formed on the substrate 10 exposed from the dummy gate layer 12, and the interlayer dielectric layer 13 exposes a top of the dummy gate layer 12.

Referring to FIG. 2, the dummy gate layer 12 is removed, to form a gate opening 14 within the interlayer dielectric layer 13.

Referring to FIG. 3, a metal gate structure 20 is formed within the gate opening 14.

With continuous reduction of a critical dimension of an integrated circuit, an opening dimension of the gate opening 14 becomes increasingly small, thereby increasing the difficulty in forming the metal gate structure 20 in the gate opening 14. Therefore, it is likely to reduce forming quality of the metal gate structure 20 within the gate opening 14. Particularly, the metal gate structure 20 is generally a film stack structure, further enhancing the difficulty in forming the metal gate structure 20 in the gate opening 14.

To address the foregoing technical problem, one form of the present disclosure provides a method for forming a semiconductor structure, including: providing a base, where a dummy gate layer is formed on the base, a spacer is formed on a side wall of the dummy gate layer, an interlayer dielectric layer is formed on the base exposed from the dummy gate layer and the spacer, and the interlayer dielectric layer exposes a top of the dummy gate layer and a top of the spacer; removing a portion of a height of the dummy gate layer to form a remaining dummy gate layer, the remaining dummy gate layer and the spacer enclosing a trench; thinning a spacer exposed from the remaining dummy gate layer along a direction perpendicular to a side wall of the trench; after the thinning, removing the remaining dummy gate layer to form a gate opening within the interlayer dielectric layer; and forming a metal gate structure in the gate opening.

In some implementations, through the thinning, the gate opening whose side wall is provided with the remaining spacer is T-shaped, so that a dimension of a top opening of the gate opening is increased, thereby reducing difficulty in forming the metal gate structure within the gate opening, and correspondingly helping to improve forming quality of the metal gate structure within the gate opening, and further improving performance of a formed transistor.

In order to make the foregoing objectives, features, and advantages of the present disclosure clearer and easier to understand, specific embodiments and implementations of the present disclosure are described in detail below with reference to the accompanying drawings.

FIG. 4 to FIG. 11 are respective schematic structural diagrams of steps in one form of a method for forming a semiconductor structure according to the present disclosure.

Figure 4:
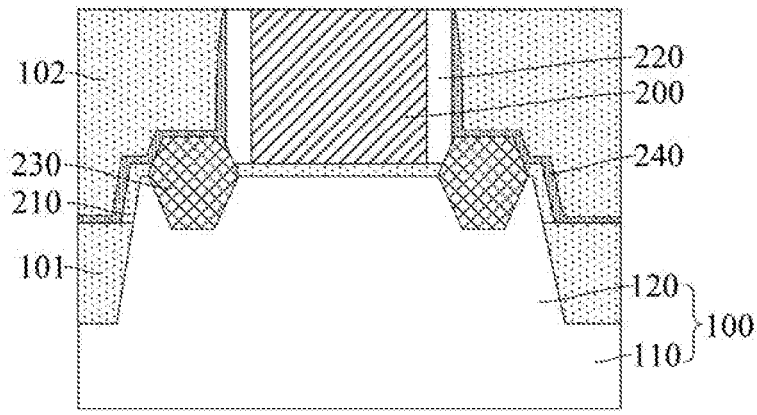
FIG. 4 to FIG. 11 are respective schematic structural diagrams of steps in one form of a method for forming a semiconductor structure according to the present disclosure.

Referring to FIG. 4, a base 100 is provided, where a dummy gate layer 200 is formed on the base 100, a spacer 220 is formed on a side wall of the dummy gate layer 200, an interlayer dielectric layer 102 is formed on the base 100 exposed from the dummy gate layer 200 and the spacer 220, and the interlayer dielectric layer 102 exposes a top of the dummy gate layer 200 and a top of the spacer 220.

In some implementations, because the formed semiconductor structure is a fin field effect transistor, the base 100 includes a substrate 110 and a plurality of discrete fins 120 located on the substrate 110.

The substrate 110 provides a process platform for subsequently forming the fin field effect transistor.

In some implementations, the substrate 110 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

The fin 120 is configured to provide a channel for the fin field effect transistor.

In some implementations, the fin 120 and the substrate 110 are an integral structure. In other implementations, the fin may also be a semiconductor layer epitaxially growing on the substrate, to precisely control a height of the fin.

Therefore, in some implementations, the fin 120 is made of a material same as that of the substrate 110, and the fin 120 is made of silicon. In other implementations, the fin may also be made of a semiconductor material suitable for forming the fin, such as germanium, silicon germanide, silicon carbide, gallium arsenide, or indium gallium. The fin may also be made of a material different from that of the substrate.

In other implementations, the formed semiconductor structure may also be a planar transistor, and the base is correspondingly a planar substrate.

It should be noted that an isolation structure 101 is further formed on the substrate 110 exposed from the fin 120, where the isolation structure 101 covers a portion of a side wall of the fin 120, and a top of the isolation structure 101 is lower than a top of the fin 120.

The isolation structure 101 is used as a shallow trench isolation (STI) structure, the isolation structure 101 being configured to isolate adjacent devices.

In some implementations, the isolation structure 101 is made of silicon oxide. In other implementations, the isolation structure may also be made of other insulating materials such as silicon nitride or silicon oxynitride.

In some implementations, the dummy gate layer 200 spans the fin 120 and covers a portion of the top of and a portion of the side wall of the fin 120.

The dummy gate layer 200 is configured to constitute a dummy gate structure. The dummy gate structure is configured to occupy a spatial position for subsequently forming a metal gate structure.

In some implementations, the dummy gate layer 200 is made of polysilicon. In other implementations, the dummy gate layer may also be made of amorphous carbon.

In some implementations, after the isolation structure 101 is formed and before the dummy gate layer 200 is formed, the method further includes: forming a dummy gate oxide layer 210 on a surface of the fin 120 exposed from the isolation structure 101.

The dummy gate oxide layer 210 is also used as a portion of the dummy gate structure. In addition, during subsequent removing of the dummy gate layer 200 through etching, a surface of the dummy gate oxide layer 210 is configured to define a stop position of the etching process, thereby reducing a probability of causing a damage to the fin 120.

In some implementations, the dummy gate oxide layer 210 is made of silicon oxide. In other implementations, the dummy gate oxide layer may also be made of silicon oxynitride.

The spacer 220 is formed on the dummy gate oxide layer 210 and covers the side wall of the dummy gate layer 200. The spacer 220 is configured to protect the side wall of the dummy gate layer 200, and is further configured to define a region for subsequently forming a source/drain doped region, so that there is a specific distance between the source/drain doped region and the metal gate structure.

The spacer 220 may be made of at least one of silicon oxide, silicon nitride, silicon carbide, silicon carbonitride, silicon oxycarbonitride, silicon oxynitride, boron nitride, or boron carbonitride, and the spacer 220 may be a single-layer structure or a laminated-layer structure.

In some implementations, the spacer 220 is a laminated structure, and the spacer 220 includes an offset spacer covering the side wall of the dummy gate layer 200 and a main spacer covering a side wall of the offset spacer.

In order to alleviate a short channel effect of the transistor, a lightly doped drain (LDD) region process is generally used as a process for forming the semiconductor structure, to form a lightly doped drain region, and the offset spacer is configured to define a position for forming the lightly doped drain region. The main spacer is used as a mask for forming a source/drain doped region.

In some implementations, that the offset spacer and the main spacer are both a single-layer structure is used as an example The offset spacer and the main spacer are both made of silicon nitride, and correspondingly, the spacer 220 is made of silicon nitride.

It should be noted that, for ease of illustration, the offset spacer and the main spacer are not distinguished in FIG. 4.

A source/drain doped region 230 is formed within the base 100 on both sides of the dummy gate layer 200. In particular, the source/drain doped region 230 is formed within the fin 120 on both sides of the dummy gate layer 200.

In some implementations, the source/drain doped region 230 includes an epitaxial layer doped with a conductive ion. When an NMOS transistor is to be formed, the epitaxial layer is made of Si or SiC, and a conductive ion within the epitaxial layer is P, As, or Sb. When a PMOS transistor is to be formed, the epitaxial layer is made of Si or SiGe, and the conductive ion within the epitaxial layer is B, Ga, or In.

An etch stop layer 240 is formed on the source/drain doped region 230. A subsequent manufacturing procedure further includes: forming a contact plug electrically connected to the source/drain doped region 230 on a top of the source/drain doped region 230. A manufacturing procedure for forming the contact plug generally includes a step of forming a contact hole within the interlayer dielectric layer using an etching process. A surface of the etch stop layer 240 is configured to define an etch stop position in the etching process. In some implementations, the etch stop layer 240 is made of silicon nitride.

It should be noted that etch stop layer 240 is formed using a deposition process. Therefore, the etch stop layer 240 conformally covers a side wall of the spacer 220, the source/drain doped region 230, the dummy gate oxide layer 210, and the isolation structure 101.

The interlayer dielectric layer 102 is configured to implement electrical isolation between adjacent devices.

The interlayer dielectric layer 102 is made of an insulating material. In some implementations, the interlayer dielectric layer 102 is made of silicon oxide. In other implementations, the interlayer dielectric layer may also be made of other dielectric materials such as silicon nitride or silicon oxynitride.

In some implementations, a top of the interlayer dielectric layer 102 is flush with a top of the dummy gate layer 200.

Figure 5:
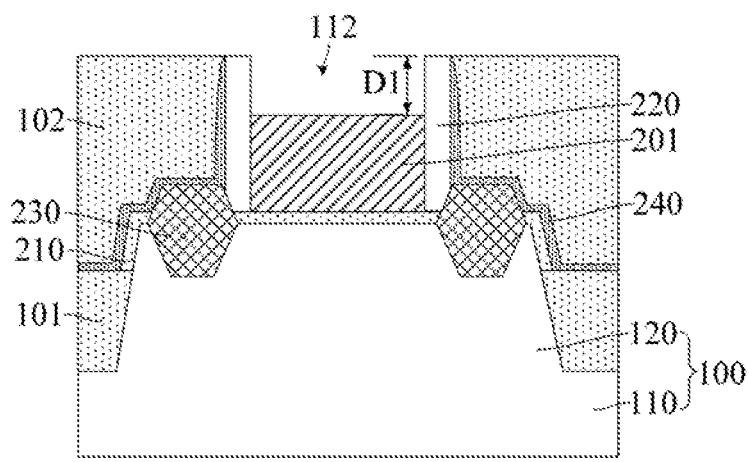

Referring to FIG. 5, a portion of a height of the dummy gate layer 200 is removed to form a remaining dummy gate layer 201, where the remaining gate layer 201 and the spacer 220 enclose a trench 112.

The step of forming the trench 112 is used to make a preparation for subsequent thinning of the spacer 220.

In particular, the spacer 220 exposed from a side wall of the trench 112 is thinned subsequently, so that after the remaining dummy gate layer 201 is removed, a T-shaped gate opening can be formed within the interlayer dielectric layer 102, thereby reducing difficulty in forming a metal gate structure within the gate opening.

In some implementations, the portion of the height of the dummy gate layer 200 is removed using a dry etching process. The dry etching process has anisotropic etching characteristics, so that efficiency of etching the dummy gate layer 200 can be improved, and an amount by which the dummy gate layer 200 is etched is helped to be controlled. In addition, a surface flatness of the remaining dummy gate layer 201 is further helped to be improved, thereby providing a good process basis for subsequently removing the remaining dummy gate layer 201.

A depth D1 of the trench 112 should be neither excessively small nor excessively large. If the depth D1 is excessively small, after a gate opening is subsequently formed, excessively few portions of the gate opening have increased opening dimensions, and therefore, it is difficult to reduce difficulty in forming the metal gate structure within the gate opening. If the depth D1 is excessively large, a probability of bridging between the contact plug and the metal gate structure is likely to be increased during subsequent forming of the contact plug within an interlayer dielectric layer on both sides of the metal gate structure. Accordingly, in some implementations, the depth D1 of the trench 112 is from 200 Å to 500 Å.

Figure 6:
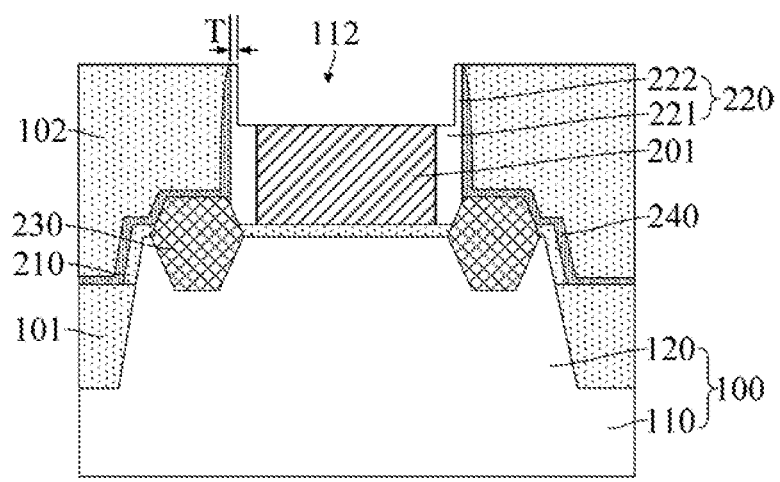

Referring to FIG. 6, a spacer 220 exposed from the remaining dummy gate layer 201 is thinned along a direction perpendicular to the side wall of the trench 112.

Through the thinning, a dimension of the trench 112 along a direction parallel to a surface of the substrate 110 is increased. Therefore, a T-shaped gate opening can be formed within the interlayer dielectric layer 102 after the remaining dummy gate layer 201 is subsequently removed.

Therefore, after the thinning, the remaining spacer 220 covering a side wall of the remaining dummy gate layer 201 is used as a bottom spacer 221, and the remaining spacer 220 exposed from the remaining dummy gate layer 201 is used as a top spacer 222. A thickness of the bottom spacer 221 is greater than a thickness of the top spacer 222 along a direction perpendicular to a side wall of the trench 112.

In some implementations, lateral etching is performed on the spacer 220 exposed from the side wall of the trench 112 using an isotropic dry etching process, thereby performing the thinning. Selection of the isotropic dry etching process helps to improve process controllability of the thinning.

In particular, a bias power of the dry etching process is reduced so that an isotropic etching effect of the spacer 220 exposed from the side wall of the trench 112 is easily implemented.

It should be noted that a thickness T of the remaining spacer 220 exposed from the remaining dummy gate layer 201 should be neither excessively small nor excessively large after the thinning. A subsequent manufacturing procedure further includes removing the remaining dummy gate layer 201 and a dummy gate oxide layer 210 at a bottom of the remaining dummy gate layer 201. If the thickness T is excessively small, an effect of protecting the remaining spacer 220 exposed from the remaining dummy gate layer 201 by the interlayer dielectric layer 102 is likely to be relatively bad, and a loss is likely to be caused to the interlayer dielectric layer 102 during removing of the dummy gate oxide layer 210. If the thickness T is excessively large, an effect of increasing the dimension of the trench 112 along the direction parallel to the surface of the substrate 100 is likely to be poor, and therefore, it is difficult to reduce the difficulty in forming the metal gate structure within the gate opening. Accordingly, in some implementations, the thickness T of the remaining spacer 220 exposed from the remaining dummy gate layer 201 is from 2 nm to 6 nm. In other words, the thickness of the top spacer 222 along the direction perpendicular to the side wall of the trench 112 is from 2 nm to 6 nm.

It should be further noted that the portion of the height of the dummy gate layer 200 (shown in FIG. 4) is removed first, so that the remaining dummy gate layer 201 is configured to define a portion to be thinned in the spacer 220. Few portions of the existing manufacturing procedure are changed, process compatibility is high, and process costs and process time are reduced.

Figure 7:
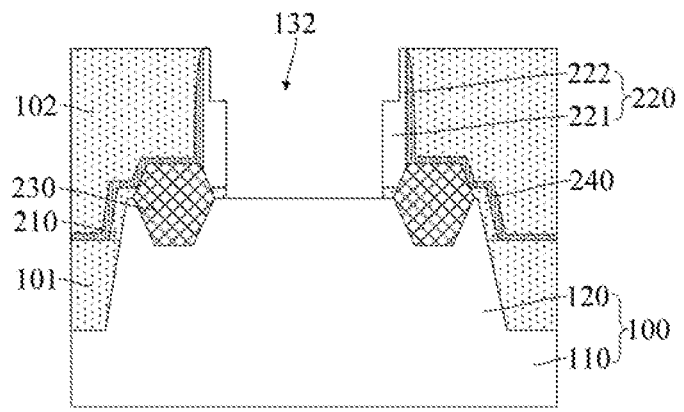

Referring to FIG. 7, after the thinning, the remaining dummy gate layer 201 (shown in FIG. 6) is removed to form a gate opening 132 within the interlayer dielectric layer 102.

The gate opening 132 is configured to provide a spatial position for subsequently forming a metal gate structure.

In some implementations, the remaining dummy gate layer 201 is removed using a dry etching process.

In some implementations, because the dummy gate oxide layer 210 is further formed on the surface of the fin 120, the surface of the dummy gate oxide layer 210 is used as a stop position to remove the remaining dummy gate layer 201.

Correspondingly, after the remaining dummy gate layer 201 is removed, the method further includes: removing the dummy gate oxide layer 210 exposed from the remaining spacer 220. In particular, the dummy gate oxide layer 210 is removed using the dry etching process to improve appearance quality of a side wall of the gate opening 132.

In some implementations, because the dummy gate layer 200 spans the fin 120 and covers a portion of the top and a portion of the side wall of the fin 120, the gate opening 132 at least exposes the portion of the top and the portion of the side wall of the fin 120, and further exposes a portion of the isolation structure 101.

Through the foregoing thinning, a remainder of the spacer 220 includes a bottom spacer 221 and a top spacer 222 located on the bottom spacer 221. In addition, because a thickness of the bottom spacer 221 is greater than a thickness of the top spacer 222 along the direction perpendicular to the side wall of the trench 112, a T-shaped gate opening 132 of the remaining side wall 220 is formed on the side wall.

Figure 8:
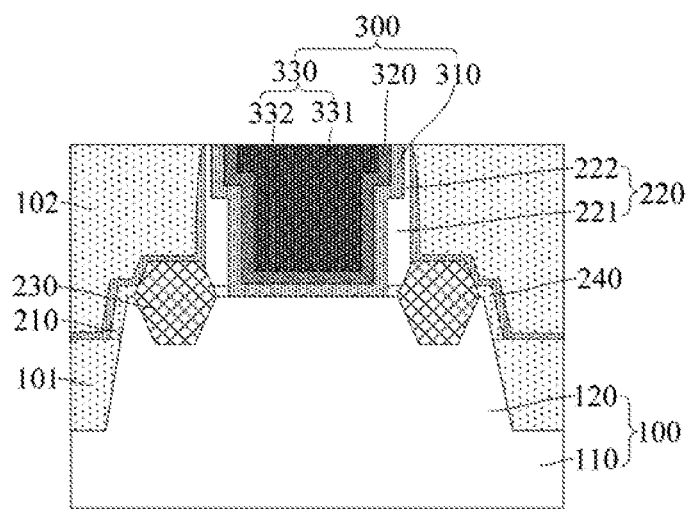

Referring to FIG. 8, a metal gate structure 300 is formed in the gate opening 132 (shown in FIG. 7).

The metal gate structure 300 is configured to control conduction and truncation of a transistor channel.

The gate opening 132 is T-shaped, so that a dimension of a top opening of the gate opening 132 is increased, thereby reducing difficulty in forming the metal gate structure 300 within the gate opening 132, correspondingly improving forming quality of the metal gate structure 300 within the gate opening 132, and further improving performance of the formed transistor.

In particular, the step of forming the metal gate structure 300 includes: forming a high-k gate dielectric layer 310, where the high-k gate dielectric layer 310 conformally covers a bottom and a side wall of the gate opening 132; forming a work function layer 320 conformally covering the high-k gate dielectric layer 310; and forming a gate electrode layer 330 filling the gate opening 132 after the work function layer 320 is formed.

The high-k gate dielectric layer 310 is configured to implement electrical isolation between the gate electrode layer 330 and the channel.

The high-k gate dielectric layer 310 is made of a high-k dielectric material. The high-k dielectric material refers to a dielectric material having a relative dielectric constant greater than a relative dielectric constant of silicon oxide. In some implementations, the high-k gate dielectric layer 310 is made of $HfO_2$. In other implementations, the high-k gate dielectric layer may also be made of a material selected from $ZrO_2$, HfSiO, HfSiON, HfTaO, HfTiO, HfZrO, or $Al_2O_3$.

The work function layer 320 is configured to adjust a threshold voltage of the formed transistor.

When a PMOS transistor is to be formed, the work function layer 320 is a P-type work function layer, that is, the work function layer 320 is made of a P-type work function material. A work function range of the material of the work function layer 320 is from 5.1 ev to 5.5 ev, for example, 5.2 ev, 5.3 ev, or 5.4 ev. The work function layer 320 is made of one or more of TiN, TaN, TaSiN, TaAlN, and TiAlN.

When an NMOS transistor is to be formed, the work function layer 320 is an N-type work function layer. That is, the work function layer 320 is made of an N-type work function material. A work function range of the material of the work function layer 320 is from 3.9 ev to 4.5 ev, for example, 4 ev, 4.1 ev, or 4.3 ev. The work function layer 320 is made of one or more of TiAl, Mo, MoN, AlN, and TiAlC.

The gate electrode layer 330 is used as an electrode to implement an electrical connection between the metal gate structure 300 and an external circuit. In some implementations, the gate electrode layer 330 is made of W. In other implementations, the gate electrode layer may also be made of Al, Cu, Ag, Au, Pt, Ni, or Ti, etc.

In some implementations, because the gate opening 132 is T-shaped, the gate electrode layer 330 is also T-shaped. The gate electrode layer 330 includes a bottom gate electrode layer 332 and a top gate electrode layer 331 located on the bottom gate electrode layer 332. A width of the top gate electrode layer 331 is greater than a width of the bottom gate electrode layer 332 along the direction perpendicular to the side wall of the gate opening 132.

The metal gate structure 300 is a film stack structure, and with the development of a super-large-scale integrate circuit, film stack is also correspondingly more complex. However, through the T-shaped gate opening 132, relatively good improvement of forming quality of the metal gate structure 300 within the gate opening 132 can still be implemented.

Figure 9:
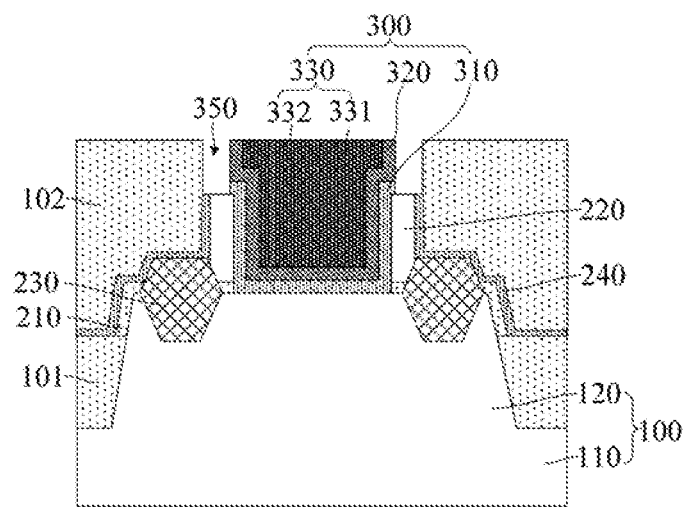
Figure 10:
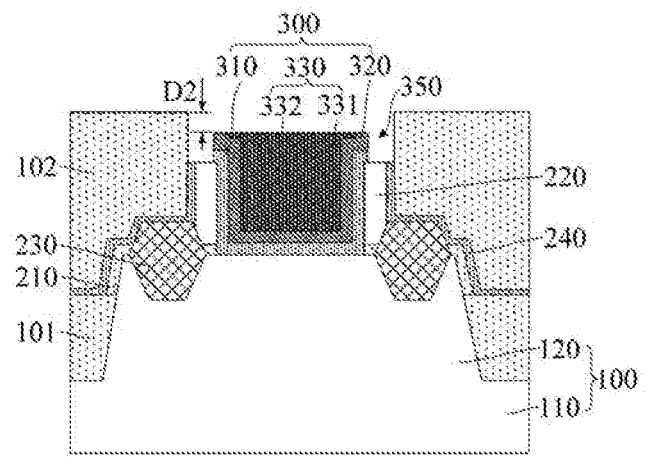
Figure 11:
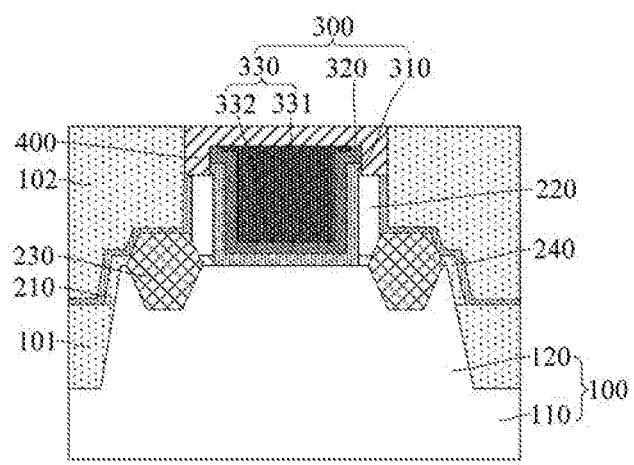

With reference to FIG. 9 to FIG. 11, after the metal gate structure 300 is formed, the method further includes: removing the high-k gate dielectric layer 310 and the top spacer 222 (shown in FIG. 8) located over the bottom spacer 221, to form a trench 350 (shown in FIG. 9) enclosed by the interlayer dielectric layer 102, the bottom spacer 221 (shown in FIG. 8), and the remainder of the metal gate structure 300, and forming an etch blocking layer 400 (shown in FIG. 11) in the trench 350.

The metal gate structure 300 is T-shaped. In other words, a width of the metal gate structure 300 that is close to the side of the top of the interlayer dielectric layer 102 is relatively large. In addition, a subsequent manufacturing procedure further includes forming a contact plug within the interlayer dielectric layer 102 on both sides of the metal gate structure 300, the contact plug being electrically connected to the source/drain doped region 230. In some implementations, the trench 350 is formed, and the etch blocking layer 400 is formed in the trench 350, so that a distance between the metal gate structure 300 that is close to the side of the top of the interlayer dielectric layer 102 and the contact plug can be increased, helping to enlarge a process window for forming the contact plug, correspondingly reducing a probability of bridging between the contact plug and the metal gate structure 300, and improving an electrical isolation effect between the contact plug and the metal gate structure 300, thereby further improving performance of the formed transistor.

In some implementations, the high-k gate dielectric layer 310 and the top spacer 222 located over the bottom spacer 221 are removed using a dry etching process, to improve controllability of the etching process, thereby reducing a damage to other films and improving appearance quality of the trench 350.

In some implementations, the steps of forming the trench 350 further includes: removing an etch stop layer 240 that is higher than a top of the bottom spacer 221. The etch stop layer 240 that is higher than the top of the bottom spacer 221 is removed, so that a dimension of the trench 350 along the direction parallel to the surface of the substrate 100 is creased, thereby reducing difficulty in subsequently forming the etch blocking layer 400 in the trench 350.

In some implementations, because the etch stop layer 240 and the top spacer 222 are both made of silicon nitride, the etch stop layer 240 and the top spacer 222 that are located over the bottom spacer 221 may be removed in a same step.

A manufacturing procedure of forming the contact plug includes a step of etching the interlayer dielectric layer 102 to form a contact hole. During etching of the interlayer dielectric layer 102, a rate at which the interlayer dielectric layer 102 is etched in the etching process is greater than a rate at which the etch blocking layer 400 is etched, so that a loss is prevented from being caused to the etch blocking layer 400, thereby preventing the contact hole from exposing the metal gate structure 300. Therefore, the etch blocking layer 400 is made of one or more of silicon nitride, silicon carbonitride, silicon oxycarbonitride, silicon oxynitride, boron nitride, and boron carbonitride.

In some implementations, the etch blocking layer 400 is made of silicon nitride. Silicon nitride is a common dielectric material with relatively high density and hardness. In a process for etching the interlayer dielectric layer 102, there is a relatively high etching selection ratio between the interlayer dielectric layer 102 and the etching blocking layer 400.

In particular, the step of forming the etch blocking layer 400 in the trench 350 includes: filling an etch blocking material layer in the trench 350; removing the etch blocking material layer that is higher than the top of the trench 350, to retain a remainder of the etch blocking material layer as the etch blocking layer 400.

In some implementations, the etch blocking material layer is filled in the trench 350 using a chemical vapor deposition process. The chemical vapor deposition process is a common deposition process with low process costs. Therefore, after the etch blocking material layer is filled in the trench 350, the etch blocking material layer further covers the interlayer dielectric layer 102.

In some implementations, the etch blocking material layer that is higher than the top of the trench 350 is removed using a chemical mechanical polishing process. In the step of the chemical mechanical polishing process, the etch blocking material layer that is higher than the top of the interlayer dielectric layer 102 is easily removed using the top of the interlayer dielectric layer 102 as a polishing stop position, so that a surface of the etch blocking layer 400 has a high flatness.

Still referring to FIG. 10, in some implementations, after the trench 350 is formed, and before the etch blocking layer 400 (shown in FIG. 11) is formed in the trench 350, the method further includes: removing a portion of a height of a remainder of the metal gate structure 300.

The portion of the height of the remainder of the metal gate structure 300 is removed, so that the etch blocking layer 400 correspondingly further covers a top of the remainder of the metal gate structure 300. Therefore, in a manufacturing procedure of forming the contact plug, the etch blocking layer 400 protects the top of the remainder of the metal gate structure 300, thereby further enlarging the process window for forming the contact plug. For example, a self-aligned contact etching process may be used.

In addition, removing the portion of the height of the remainder of the metal gate structure 300 helps a top face of the etch blocking layer 400 to be flush with the top of the interlayer dielectric layer 102, so that the surface flatness of the etch blocking layer 400 is improved, thereby providing a good process basis for a subsequent manufacturing procedure.

In some implementations, the portion of the height of the remainder of the metal gate structure 300 is removed using a dry etching process. Selecting the dry etching process helps to control an amount by which the remainder of the metal gate structure 300 is etched. In addition, the dry etching process has anisotropic etching characteristics, helping to reduce a damage caused to a side wall of the remainder of the metal gate structure 300, thereby improving appearance quality of the remainder of the metal gate structure 300.

After the portion of the height of the remainder of the metal gate structure 300 is removed, a distance D2 between the top of the remainder of the metal gate structure 300 and the top of the interlayer dielectric layer 102 should be neither excessively small nor excessively large. If the distance D2 is excessively small, after the etch blocking layer 400 is subsequently formed, a thickness of the etch blocking layer 400 on the top of the remainder of the metal gate structure 300 is correspondingly excessively small, impeding enlargement of the process window for forming the contact plug. If the distance D2 is excessively large, a thickness of the remainder of the metal gate structure 300 is correspondingly excessively small, and therefore a capability of controlling a channel by the remainder of the metal gate structure 300 is likely to deteriorate. Consequently, performance of the transistor deteriorates. Accordingly, in some implementations, the distance D2 between the remainder of the top of the metal gate structure 300 and the top of the interlayer dielectric layer 102 is from 10 nm to 30 nm.

Correspondingly, as shown in FIG. 11, after the etch blocking layer 400 is formed in the trench 350 (shown in FIG. 9), the etch blocking layer 400 further covers the top of the remainder of the metal gate structure 300.

The present disclosure further provides a semiconductor structure. Still referring to FIG. 8, a schematic structural diagram of one form of a semiconductor structure according to the present disclosure is shown.

The semiconductor structure includes: a base 100; an interlayer dielectric layer 102 located on the base 100; a gate opening 132 (shown in FIG. 7) exposing the base 100 being formed within the interlayer dielectric layer 102; a spacer 220 located on a side wall of the gate opening 132, the spacer 220 including a bottom spacer 221 and a top spacer 222 located on the bottom spacer 221, and along a direction perpendicular to the side wall of the gate opening 132, a thickness of the bottom spacer 221 being greater than a thickness of the top spacer 222; and a T-shaped metal gate structure 300 located within the gate opening 132 between the spacers 220.

In some implementations, because the semiconductor structure is a fin field effect transistor, the base 100 includes a substrate 110 and a plurality of discrete fins 120 located on the substrate 110.

In some implementations, the substrate 110 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 120 is made of a material same as that of the substrate 110, and the fin 120 is made of silicon. In other implementations, the fin may also be made of a semiconductor material suitable for forming the fin, such as germanium, silicon germanide, silicon carbide, gallium arsenide, or indium gallium. The fin may also be made of a material different from that of the substrate.

In other implementations, the semiconductor structure may also be a planar transistor, and the base is correspondingly a planar substrate.

An isolation structure 101 is further formed on the substrate 110 exposed from the fin 120, the isolation structure 101 covering a portion of a side wall of the fin 120, and a top of the isolation structure 101 being lower than a top of the fin 120.

In some implementations, the isolation structure 101 is made of silicon oxide. In other implementations, the isolation structure may also be made of other insulating materials such as silicon nitride or silicon oxynitride.

The interlayer dielectric layer 102 is configured to implement electrical isolation between adjacent devices. In some implementations, the interlayer dielectric layer 102 is made of silicon oxide. In other implementations, the interlayer dielectric layer may also be made of other dielectric materials such as silicon nitride or silicon oxynitride.

The semiconductor structure further includes: a source/drain doped region 230 located within the base 100 on both sides of the gate opening 132. In particular, the source/drain doped region 230 is located within the fin 120 on both sides of the gate opening 132.

In some implementations, the source/drain doped region 230 includes an epitaxial layer doped with a conductive ion. When the semiconductor structure is an NMOS transistor, the epitaxial layer is made of Si or SiC, and a conductive ion within the epitaxial layer is P, As, or Sb. When the semiconductor structure is a PMOS transistor, the epitaxial layer is made of Si or SiGe, and the conductive ion within the epitaxial layer is B, Ga, or In.

The spacer 220 is configured to protect a side wall of the metal gate layer 300, and is further configured to define a region for forming the source/drain doped region 230, so that there is a specific distance between the source/drain doped region 230 and the metal gate structure 300.

In some implementations, the spacer 220 includes the bottom spacer 221 and the top spacer 222 located on the bottom spacer 221, and along the direction perpendicular to the side wall of the gate opening 132, the thickness of the bottom spacer 221 is greater than the thickness of the top spacer 222. The top spacer 222 is obtained through thinning of a portion of a height of the spacer 220.

The thickness of the bottom spacer 221 is greater than the thickness of the top spacer 222, so that the gate opening 132 whose side wall is provided with the spacer 220 is T-shaped, that is, a dimension of a top opening of the gate opening 132 is increased, so that difficulty in forming the metal gate structure 300 within the gate opening 132 is reduced, that is, forming quality of the metal gate structure 300 within the gate opening 132 is helped to be improved, thereby improving performance of a transistor.

The spacer 220 may be made of at least one of silicon oxide, silicon nitride, silicon carbide, silicon carbonitride, silicon oxycarbonitride, silicon oxynitride, boron nitride, or boron carbonitride, and the spacer 220 may be a single-layer structure or a laminated-layer structure. In some implementations, the bottom spacer 221 is a laminated structure, and the bottom spacer 221 includes an offset spacer covering a portion of the side wall of the metal gate layer 300 and a main spacer covering a side wall of the offset spacer.

In order to alleviate a short channel effect of the transistor, the semiconductor structure generally further includes a lightly doped drain region, and the offset spacer is configured to define a position for forming the lightly doped drain region. The main spacer is used as a mask for forming a source/drain doped region.

In some implementations, that the offset spacer and the main spacer are both a single-layer structure is used as an example. The offset spacer and the main spacer are both made of silicon nitride, and correspondingly, the spacer 220 is made of silicon nitride.

It should be noted that, according to the thickness of the top spacer 222, the top spacer 222 may include the offset spacer and the main spacer covering the side wall of the offset spacer, or may include only the main spacer.

It should be further noted that, for ease of illustration, the offset spacer and the main spacer are not distinguished in FIG. 8.

A height of the top spacer 222 should be neither excessively small nor excessively large. If the height is excessively small, excessively few portions of the gate opening 132 have increased opening dimensions, and therefore, it is difficult to reduce difficulty in forming the metal gate structure 300 within the gate opening 132. If the height is excessively large, a probability of bridging between the contact plug and the metal gate structure 300 is likely to be increased during forming of the contact plug within an interlayer dielectric layer 102 on both sides of the metal gate structure 300. Accordingly, in some implementations, the height of the top spacer 222 is from 200 A to 500 A.

The thickness of the top spacer 222 should be neither excessively small nor excessively large. The metal gate structure 300 is formed through a high k last metal gate last process. Therefore, in the process for forming the semiconductor structure, before the metal gate structure 300 is formed, the forming process generally includes a manufacturing procedure of removing a dummy gate structure. If the thickness is excessively small, an effect of protecting the interlayer dielectric layer 102 by the top spacer 222 is likely to be relatively bad, and a loss is likely to be caused to the interlayer dielectric layer 102 during removing of the dummy gate oxide layer. If the thickness is excessively large, an effect of increasing an opening dimension of a top of the gate opening 132 is likely to be poor, and therefore, it is difficult to reduce the difficulty in forming the metal gate structure 300 within the gate opening 132. Accordingly, in some implementations, the thickness of the top spacer 222 nm along the direction perpendicular to the side wall of the gate opening 132 is from 2 nm to 6.

In the process for forming the semiconductor structure, the dummy gate structure includes a dummy gate oxide layer 210. Therefore, the semiconductor structure further includes: the dummy gate oxide layer 210 located between the spacer 220 and the fin 110 and between the interlayer dielectric layer 102 and the fin 110.

In some implementations, the dummy gate oxide layer 210 is made of silicon oxide. In other implementations, the dummy gate oxide layer may also be made of silicon oxynitride.

The semiconductor structure further includes an etch stop layer 240 located on the source/drain doped region 230.

A manufacturing procedure of forming the contact plug generally includes a step of forming a contact hole within the interlayer dielectric layer 102 using an etching process. A surface of the etch stop layer 240 is configured to define an etch stop position in the etching process. In some implementations, the etch stop layer 240 is made of silicon nitride.

The etch stop layer 240 is formed using a deposition process. Therefore, the etch stop layer 240 conformally covers a side wall of the spacer 220, the source/drain doped region 230, the dummy gate oxide layer 210, and an isolation structure 101.

The metal gate structure 300 includes: a high-k gate dielectric layer 310 conformally covering a bottom and a side wall of the gate opening 132; a work function layer 320 conformally covering the high-k gate dielectric layer 310; and a gate electrode layer 330 located within the gate opening 132.

In some implementations, the high-k gate dielectric layer 310 is made of $HfO_2$. In other implementations, the high-k gate dielectric layer may also be made of a material selected from $ZrO_2$, HfSiO, HfSiON, HfTaO, HfTiO, HfZrO, or $Al_2O_3$.

When the semiconductor structure is a PMOS transistor, the work function layer 320 is made of one or more of TiN, TaN, TaSiN, TaAlN, and TiAlN. When the semiconductor structure is an NMOS transistor, the work function layer 320 is made of one or more of TiAl, Mo, MoN, AlN, and TiAlC.

In some implementations, the gate electrode layer 330 is made of W. In other implementations, the gate electrode layer may also be made of Al, Cu, Ag, Au, Pt, Ni, or Ti, etc.

In some implementations, because the metal gate structure 300 is T-shaped, the gate electrode layer 330 is also T-shaped. The gate electrode layer 330 includes a bottom gate electrode layer 332 and a top gate electrode layer 331 located on the bottom gate electrode layer 332. A width of the top gate electrode layer 331 is greater than a width of the bottom gate electrode layer 332 along the direction perpendicular to the side wall of the gate opening 132.

The semiconductor structure may be formed using the forming method described in the foregoing embodiments, or may be formed using other forming methods. For detailed descriptions of the semiconductor structure in some implementations, reference may be made to the corresponding descriptions in the foregoing embodiments, and details are not described again in some implementations.

Figure 12:
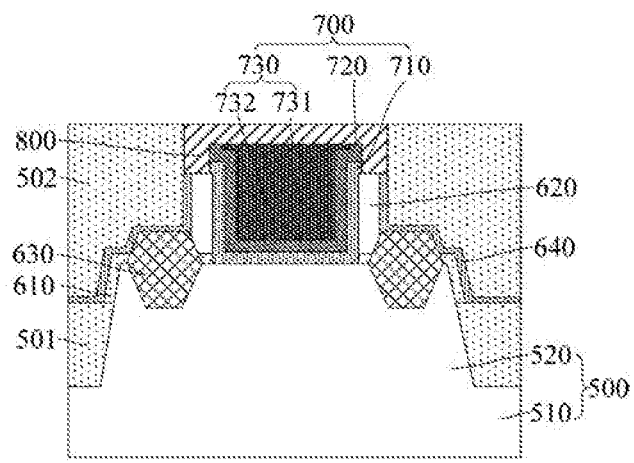
FIG. 12 is a schematic structural diagram of one form of a transistor according to the present disclosure.

Correspondingly, the present disclosure further provides a transistor. Referring to FIG. 12, a schematic structural diagram of an embodiment of a transistor according to the present disclosure is shown.

The transistor includes: a base 500; an interlayer dielectric layer 502 located on the base 500, a gate opening (not shown) exposing the base 500 being formed within the interlayer dielectric layer 502; a bottom spacer 620 covering a portion of a side wall of the gate opening that is close to a side of the base 500; a metal gate structure 700 located in the gate opening exposed from the bottom spacer 620, the metal gate structure 700 including: a T-shaped gate electrode layer 730, the gate electrode layer 730 including a bottom gate electrode layer 732 and a top gate electrode layer 731 located on the bottom gate electrode layer 732, and along a direction perpendicular to the side wall of the gate opening, a width of the top gate electrode layer 731 being greater than a width of the bottom gate electrode layer 732; a work function layer 720 located on a side wall of the bottom gate electrode layer 732, on a side wall and a bottom of the top gate electrode layer 731, and between a bottom of the gate electrode layer 730 and the base 500; a high-k gate dielectric layer 710 located between the work function layer 720 and the spacer 620 and between the work function layer 720 and the base 500; a trench (not shown) enclosed by the interlayer dielectric layer 502, the spacer 620, and the metal gate structure 700; and an etch blocking layer 800 located within the trench.

In some implementations, because the semiconductor structure is a fin field effect transistor, the base 500 includes a substrate 510 and a plurality of discrete fins 520 located on the substrate 510.

In some implementations, the substrate 510 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 520 is made of a material same as that of the substrate 510, and the fin 520 is made of silicon. In other implementations, the fin may also be made of a semiconductor material suitable for forming the fin, such as germanium, silicon germanide, silicon carbide, gallium arsenide, or indium gallium. The fin may also be made of a material different from that of the substrate.

In other implementations, the semiconductor structure may also be a planar transistor, and the base is correspondingly a planar substrate.

An isolation structure 501 is further formed on the substrate 510 exposed from the fin 520, the isolation structure 501 covering a portion of a side wall of the fin 520, and a top of the isolation structure 501 being lower than a top of the fin 520. The isolation structure 501 is configured to isolate adjacent devices. In some implementations, the isolation structure 501 is made of silicon oxide. In other implementations, the isolation structure may also be made of other insulating materials such as silicon nitride or silicon oxynitride.

In some implementations, the interlayer dielectric layer 502 is made of silicon oxide. In other implementations, the interlayer dielectric layer may also be made of other dielectric materials such as silicon nitride or silicon oxynitride.

The semiconductor structure further includes a source/drain doped region 630 located within the base 500 on two sides of the gate opening. In particular, the source/drain doped region 630 is located within the fin 520 on both sides of the gate opening.

The bottom spacer 620 is configured to protect the portion of the side wall of the metal gate structure 700 and is further configured to create a distance between the source/drain doped region 630 and the metal gate structure 700.

The bottom spacer 620 may be made of at least one of silicon oxide, silicon nitride, silicon carbide, silicon carbonitride, silicon oxycarbonitride, silicon oxynitride, boron nitride, or boron carbonitride, and the bottom spacer 620 may be a single-layer structure or a laminated-layer structure.

In some implementations, the bottom spacer 620 is a laminated structure, and the bottom spacer 620 includes an offset spacer covering the portion of the side wall of the metal gate layer 700 and a main spacer covering a side wall of the offset spacer.

In order to alleviate a short channel effect of the transistor, the semiconductor structure generally further includes a lightly doped drain region, and the offset spacer is configured to define a position for forming the lightly doped drain region. The main spacer is used as a mask for forming a source/drain doped region 630.

In some implementations, that the offset spacer and the main spacer are both a single-layer structure is used as an example. The offset spacer and the main spacer are both made of silicon nitride, and correspondingly, the bottom spacer 620 is made of silicon nitride.

It should be noted that, for ease of illustration, the offset spacer and the main spacer are not distinguished in FIG. 12.

In some implementations, the metal gate structure 700 is formed using a high k last metal gate last process. Therefore, the semiconductor structure further includes a dummy gate oxide layer 610 located between the bottom spacer 620 and the fin 510 and between the interlayer dielectric layer 502 and the fin 510.

In some implementations, the dummy gate oxide layer 610 is made of silicon oxide. In other implementations, the dummy gate oxide layer may also be made of silicon oxynitride.

The metal gate structure 700 includes: a T-shaped gate electrode layer 730, including a bottom gate electrode layer 732 and a top gate electrode layer 731 located on the bottom gate electrode layer 732; a work function layer 720 located on a side wall of the bottom gate electrode layer 732, on a side wall and a bottom of the top gate electrode layer 731, and between a bottom of the gate electrode layer 730 and the base 700; and a high-k gate dielectric layer 710 located between the work function layer 720 and the bottom spacer 620 and between the work function layer 720 and the base 500.

In some implementations, the high-k gate dielectric layer 710 is made of $HfO_2$. In other implementations, the high-k gate dielectric layer may also be made of a material selected from $ZrO_2$, HfSiO, HfSiON, HfTaO, HfTiO, HfZrO, or $Al_2O_3$.

When the transistor is a PMOS transistor, the work function layer 720 is made of one or more of TiN, TaN, TaSiN, TaAlN, and TiAlN. When the transistor is an NMOS transistor, the work function layer 320 is made of one or more of TiAl, Mo, MoN, AlN, and TiAlC.

In some implementations, the gate electrode layer 730 is made of W. In other implementations, the gate electrode layer may also be made of Al, Cu, Ag, Au, Pt, Ni, or Ti, etc.

The trench is enclosed by the interlayer dielectric layer 502, the bottom spacer 620, and the metal gate structure 700, where the trench is configured to provide a spatial position for forming an etch blocking layer 800. Because the gate electrode layer 730 is T-shaped, the metal gate structure 700 that is close to a side of a top of the interlayer dielectric layer 502 is relatively wide. The semiconductor structure generally further includes a contact plug located within the interlayer dielectric layer 502 on both sides of the metal gate structure 700, the contact plug being electrically connected to the source/drain doped region 630. In some implementations, through the etch blocking layer 800 located within the trench, a distance between the metal gate structure 700 that is close to the side of the top of the interlayer dielectric layer 502 and the contact plug can be increased, helping to enlarge a process window for forming the contact plug, correspondingly reducing a probability of bridging between the contact plug and the metal gate structure 700, and improving an electrical isolation effect between the contact plug and the metal gate structure 700, thereby improving performance of the transistor.

A manufacturing procedure of forming the contact plug includes a step of etching the interlayer dielectric layer 502 to form a contact hole. A rate at which the interlayer dielectric layer 502 is etched in the etching process is greater than a rate at which the etch blocking layer 800 is etched, so that a loss is prevented from being caused to the etch blocking layer 800, thereby preventing the contact hole from exposing the metal gate structure 700. Therefore, the etch blocking layer 800 is made of at least one of silicon nitride, silicon carbonitride, silicon oxycarbonitride, silicon oxynitride, boron nitride, or boron carbonitride. In some implementations, the etch blocking layer 800 is made of silicon nitride.

In some implementations, a top of the metal gate structure 700 is lower than a top of the interlayer dielectric layer 502.

The etch blocking layer 800 further covers the top of the metal gate structure 700. In a manufacturing procedure of forming the contact plug, the etch blocking layer 800 protects the top of the metal gate structure 700, thereby further enlarging the process window for forming the contact plug. For example, a self-aligned contact etching process may be used. In addition, the top of the metal gate structure 700 is lower than the top of the interlayer dielectric layer 502, so that a surface flatness of the etch blocking layer 800 is helped to be improved, thereby providing a good process basis for a subsequent manufacturing procedure.

A distance between the top of the metal gate structure 700 and the top of the interlayer dielectric layer 502 should be neither excessively small nor excessively large. If the distance is excessively small, a thickness of the etch blocking layer 800 on the top of the metal gate structure 700 is correspondingly excessively small, impeding enlargement of the process window for forming the contact plug. If the distance is excessively large, a thickness of the metal gate structure 700 is correspondingly excessively small, and therefore a capability of controlling a channel by the metal gate structure 700 is likely to deteriorate. Consequently, performance of the transistor deteriorates. Accordingly, in some implementations, the distance between the top of the metal gate structure 700 and the top of the interlayer dielectric layer 502 is from 10 nn to 30 nm.

In some implementations, the semiconductor structure further includes an etch stop layer 640 located between the bottom spacer 620 and the interlayer dielectric layer 502. The etch stop layer 640 is further located on the source/drain doped region 630. The process for forming the transistor generally includes forming, on a top of the source/drain doped region 630, a contact plug electrically connected to the source/drain doped region 630. In addition, a manufacturing procedure of forming the contact plug generally includes a step of forming a contact hole within the interlayer dielectric layer 502 using an etching process. A surface of the etching stop layer 640 is configured to define an etch stop position in the etching process. In some implementations, the etch stop layer 640 is made of silicon nitride.

In some implementations, the etch stop layer 640 is located between the bottom spacer 620 and the interlayer dielectric layer 502, so that the interlayer dielectric layer 502, the etch stop layer 640, the bottom spacer 620, and the metal gate structure 700 enclose the trench, increasing a dimension of the trench along a direction perpendicular to a surface of the substrate 510, thereby reducing difficulty in forming the etch blocking layer 800 in the trench.

The etch stop layer 640 is formed using a deposition process. Therefore, the etch stop layer 640 conformally covers a side wall of the bottom spacer 620, the source/drain doped region 630, the dummy gate oxide layer 610, and the isolation structure 501.

The semiconductor structure may be formed using the forming method described in the foregoing embodiments, or may be formed using other forming methods. For detailed descriptions of the semiconductor structure in some implementations, reference may be made to the corresponding descriptions in the foregoing embodiments, and details are not described again in some implementations.

Although the present disclosure is disclosed above, the present disclosure is not limited thereto. Various changes and modifications may be made by those skilled in the art without departing from the spirit and scope of the present disclosure, and thus the scope of the present disclosure should be subject to the scope defined by the claims.

What is claimed is:

1. A method for forming a semiconductor structure, comprising:

providing a base, on which a dummy gate layer is formed, where a spacer is formed on a side wall of the dummy gate layer, an interlayer dielectric layer is formed on the base exposed from the dummy gate layer and the spacer, and the interlayer dielectric layer exposes a top of the dummy gate layer and a top of the spacer;

removing a portion of a height of the dummy gate layer to form a remaining dummy gate layer, where the remaining dummy gate layer and the spacer enclose a trench;

thinning the spacer exposed from the remaining dummy gate layer along a direction perpendicular to a side wall of the trench, wherein after the spacer is thinned, a remaining spacer covering a side wall of the remaining dummy gate layer is used as a bottom spacer, and a remaining spacer exposed from the remaining dummy gate layer is used as a top spacer;

after the thinning, removing the remaining dummy gate layer to form a gate opening within the interlayer dielectric layer; and forming a metal gate structure within the gate opening, wherein forming the metal gate structure comprises:
forming a high-k gate dielectric layer, where the high-k gate dielectric layer conformally covers a bottom and a side wall of the gate opening;
forming a work function layer conformally covering the high-k gate dielectric layer; and
forming a gate electrode layer filling the gate opening after the work function layer is formed;

after forming the metal gate structure within the gate opening, removing the high-k gate dielectric layer and a top spacer that are located over the bottom spacer, to form a trench enclosed by the interlayer dielectric layer, the bottom spacer, and a remainder of the metal gate structure; and forming an etch blocking layer within the trench.

2. The method for forming a semiconductor structure according to claim 1, wherein:

in the step of providing the base, an etch stop layer is formed between the spacer and the interlayer dielectric layer; and the step of forming the trench further comprises: removing an etch stop layer that is higher than a top of the bottom spacer.

3. The method for forming a semiconductor according to claim 1, wherein:

the method further comprises: after forming a trench and before forming an etch blocking layer within the trench, removing a portion of a height of the remainder of the metal gate structure; and in the step of forming the etch blocking layer within the trench, the etch blocking layer further covers a top of the remainder of the metal gate structure.

4. The method for forming a semiconductor structure according to claim 3, wherein the portion of the height of the remainder of the metal gate structure is removed using a dry etching process.

5. The method for forming a semiconductor structure according to claim 3, wherein after the portion of the height of the remainder of the metal gate structure is removed, a distance from the top of the remainder of the metal gate structure to a top of the interlayer dielectric layer is from 10 nm to 30 nm.

6. The method for forming a semiconductor structure according to claim 1, wherein the step of forming the etch blocking layer within the trench comprises:

filling an etch blocking material layer within the trench; and removing the etch blocking material layer that is higher than a top of the trench, to retain a remainder of the etch blocking material layer as the etch blocking layer.

7. The method for forming a semiconductor structure according to claim 6, wherein the etch blocking material layer is filled within the trench using a chemical vapor deposition process.

8. The method for forming a semiconductor structure according to claim 6, wherein the etch blocking material layer that is higher than the top of the trench is removed using a chemical mechanical polishing process.

9. The method for forming a semiconductor structure according to claim 1, wherein the etch blocking layer is made of at least one of silicon nitride, silicon carbonitride, silicon oxycarbonitride, silicon oxynitride, boron nitride, or boron carbonitride.

10. The method for forming a semiconductor structure according to claim 1, wherein the high-k gate dielectric layer and the top spacer that are located over the bottom spacer are removed using a dry etching process.

11. A method for forming a semiconductor structure, comprising:

providing a base, on which a dummy gate layer is formed, where a spacer is formed on a side wall of the dummy gate layer, an interlayer dielectric layer is formed on the base exposed from the dummy gate layer and the spacer, and the interlayer dielectric layer exposes a top of the dummy gate layer and a top of the spacer;

removing a portion of a height of the dummy gate layer to form a remaining dummy gate layer, where the remaining dummy gate layer and the spacer enclose a trench;

thinning the spacer exposed from the remaining dummy gate layer along a direction perpendicular to a side wall of the trench;

after the thinning, removing the remaining dummy gate layer to form a gate opening within the interlayer dielectric layer; and forming a metal gate structure within the gate opening;

wherein in the step of forming the trench, a depth of the trench is from 200 Å to 500 Å.

12. A method for forming a semiconductor structure, comprising:

providing a base, on which a dummy gate layer is formed, where a spacer is formed on a side wall of the dummy gate layer, an interlayer dielectric layer is formed on the base exposed from the dummy gate layer and the spacer, and the interlayer dielectric layer exposes a top of the dummy gate layer and a top of the spacer;

removing a portion of a height of the dummy gate layer to form a remaining dummy gate layer, where the remaining dummy gate layer and the spacer enclose a trench;

thinning the spacer exposed from the remaining dummy gate layer along a direction perpendicular to a side wall of the trench;

after the thinning, removing the remaining dummy gate layer to form a gate opening within the interlayer dielectric layer; and forming a metal gate structure within the gate opening;

wherein after the spacer exposed from the remaining dummy gate layer is thinned, a thickness of a remaining spacer exposed from the remaining dummy gate layer is from 2 nm to 6 nm.

13. The method for forming a semiconductor structure according to claim 1, wherein the spacer exposed from the remaining dummy gate layer is thinned using an isotropic dry etching process.

14. The method for forming a semiconductor structure according to claim 1, wherein a portion of a height of the dummy gate layer is removed using a dry etching process.

15. A semiconductor structure, comprising:

a base;

an interlayer dielectric layer located on the base, wherein a gate opening exposing the base is formed within the interlayer dielectric layer;

a spacer located on a side wall of the gate opening, wherein the spacer comprises a bottom spacer and a top spacer located on the bottom spacer, and wherein along a direction perpendicular to the side wall of the gate opening, a thickness of the bottom spacer is greater than a thickness of the top spacer; and a T-shaped metal gate structure located within the gate opening between the spacers.

16. The semiconductor structure according to claim 15, wherein a height of the top spacer is from 200 Å to 500 Å.

17. The semiconductor structure according to claim 15, wherein the thickness of the top spacer is from 2 nm to 6 nm along the direction perpendicular to the side wall of the gate opening.

18. A transistor, comprising:

a base;

an interlayer dielectric layer located on the base, wherein a gate opening exposing the base is formed within the interlayer dielectric layer;

a bottom spacer covering a portion of a side wall of the gate opening that is close to a side of the base;

a metal gate structure located within the gate opening exposed from the bottom spacer, the metal gate structure comprising:

a T-shaped gate electrode layer, where the gate electrode layer comprises a bottom gate electrode layer and a top gate electrode layer located on the bottom gate electrode layer, and wherein along a direction perpendicular to a side wall of the gate opening, a width of the top gate electrode layer is greater than a width of the bottom gate electrode layer;

a work function layer located on a side wall of the bottom gate electrode layer, on a side wall and a bottom of the top gate electrode layer, and between a bottom of the gate electrode layer and the base; and a high-k gate dielectric layer located between the work function layer and the bottom spacer and between the work function layer and the base;

a trench enclosed by the interlayer dielectric layer, the bottom spacer, and the metal gate structure; and an etch blocking layer located within the trench;

wherein a top of the metal gate structure is lower than a top of the interlayer dielectric layer;

wherein the etch blocking layer further covers the top of the metal gate structure; and wherein a distance between the top of the metal gate structure and the top of the interlayer dielectric layer is from 10 nm to 30 nm.

19. The transistor according to claim 18, wherein:

the semiconductor structure further comprises an etch stop layer located between the bottom spacer and the interlayer dielectric layer; and the trench is enclosed by the interlayer dielectric layer, the etch stop layer, the bottom spacer, and the metal gate structure.

20. The transistor according to claim 18, wherein the etch blocking layer is made of at least one of silicon nitride, silicon carbonitride, silicon oxycarbonitride, silicon oxynitride, boron nitride, or boron carbonitride.

* * * * *